(12) United States Patent
Chen et al.

(10) Patent No.: US 9,922,976 B1
(45) Date of Patent: Mar. 20, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yen-Yu Chen, Hsinchu (TW); Ming-Huei Lin, Hsinchu (TW); Chih-Pin Tsao, Hsinchu County (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/272,500

(22) Filed: Sep. 22, 2016

(51) Int. Cl.
| | |
|---|---|
| *H01L 27/10* | (2006.01) |
| *H01L 27/088* | (2006.01) |
| *H01L 29/49* | (2006.01) |
| *H01L 29/423* | (2006.01) |
| *H01L 21/28* | (2006.01) |
| *H01L 21/8234* | (2006.01) |

(52) U.S. Cl.
CPC .... *H01L 27/0886* (2013.01); *H01L 21/28088* (2013.01); *H01L 21/823456* (2013.01); *H01L 29/42372* (2013.01); *H01L 29/4966* (2013.01); *H01L 21/823431* (2013.01)

(58) Field of Classification Search
CPC ............. H01L 27/0886; H01L 29/4966; H01L 29/42372
USPC ........................................................ 257/204
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2008/0274598 A1* | 11/2008 | Ramin | H01L 21/28026 438/231 |
| 2009/0072274 A1* | 3/2009 | Knoefler | H01L 27/11573 257/204 |
| 2014/0282326 A1 | 9/2014 | Chen et al. | |
| 2014/0367790 A1* | 12/2014 | Choi | H01L 21/823443 257/369 |
| 2017/0117187 A1* | 4/2017 | Ando | H01L 21/823807 |

* cited by examiner

*Primary Examiner* — David S Blum
(74) *Attorney, Agent, or Firm* — McClure, Qualey & Rodack, LLP (57) ABSTRACT

A semiconductor device includes a first semiconductor channel, a second semiconductor channel, a first gate stack and a second gate stack. The first gate stack is present on the first semiconductor channel. The second gate stack is present on the second semiconductor channel. The first gate stack and the second gate stack are different at least in tantalum nitride amount.

20 Claims, 13 Drawing Sheets

Fig. 13

SEMICONDUCTOR DEVICE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, may be a Fin field effect transistor (FinFET) device. The following disclosure will continue with a FinFET example to illustrate various embodiments of the present application. It is understood, however, that the application should not be limited to a particular type of device.

Figure 1:
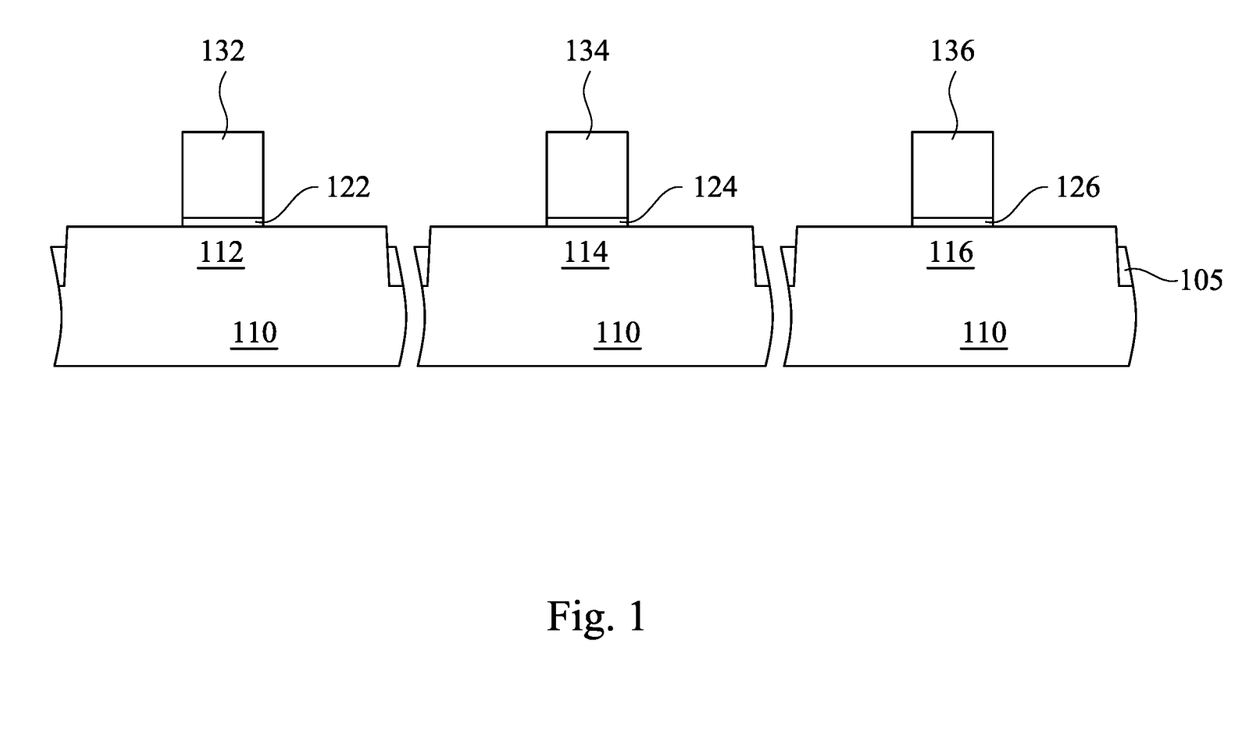
FIG. 1 to FIG. 13 are cross-sectional views of a method for manufacturing a semiconductor device at various stages in accordance with some embodiments of the present disclosure.

FIG. 1 to FIG. 13 are cross-sectional views of a method for manufacturing a semiconductor device at various stages in accordance with some embodiments of the present disclosure. Reference is made to FIG. 1. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

Semiconductor fins 112, 114 and 116 are formed on the substrate 110. In some embodiments, the semiconductor fins 112, 114 and 116 include silicon. The semiconductor fins 112, 114 and 116 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a desired pattern (the semiconductor fins 112, 114 and 116 in this case) and developed to remove portions of the photoresist material. The remaining photoresist material protects the underlying material from subsequent processing steps, such as etching. It is noted that other masks, such as an oxide or silicon nitride mask, may also be used in the etching process. The quantity of the semiconductor fins is exemplary, and is not limiting the disclosure.

An isolation dielectric 105 is formed to fill trenches among the semiconductor fins 112, 114 and 116 as shallow trench isolation (STI). The isolation dielectric 105 may include any suitable dielectric material, such as silicon oxide. The method of forming the isolation dielectric 105 may include depositing an isolation dielectric 105 on the substrate 110 to cover the semiconductor fins 112, 114 and 116, optionally performing a planarization process to remove the excess isolation dielectric 105 outside the trenches, and then performing an etching process on the isolation dielectric 105 until upper portions of the semiconductor fins 112, 114 and 116 are exposed.

Gate dielectrics 122, 124 and 126 are formed on the semiconductor fins 112, 114 and 116, and the substrate 110, respectively. The gate dielectrics 122, 124 and 126 may be formed by thermal oxidation, chemical vapor deposition, sputtering, or other suitable methods for forming a gate dielectric. The gate dielectrics 122, 124 and 126 can be patterned to respectively wrap central portions of the semiconductor fins 112, 114 and 116 and respectively expose portions of the semiconductor fins 112, 114 and 116. At least one of the gate dielectrics 122, 124 and 126 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, at least one of the gate dielectrics 122, 124 and 126 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. At least one of the gate dielectrics 122, 124 and 126 may have a multilayer structure such as one layer of silicon oxide (e.g., interfacial layer) and another layer of high-k material. At least one of the gate dielectrics 122, 124 and 126 may be formed using chemical vapor deposition (CVD), physical vapor deposition (PVD), atomic layer deposition (ALD), thermal oxide, ozone oxidation, other suitable processes, or combinations thereof.

Dummy gate structures 132, 134 and 136 are respectively formed on the gate dielectrics 122, 124 and 126. At least one of the dummy gate structures 132, 134 and 136 may be formed by CVD, sputter deposition, or by other suitable technique for depositing conductive materials. The dummy gate structures 132, 134 and 136 can be patterned to respectively wrap central portions of the semiconductor fins 112, 114 and 116 and respectively expose portions of the semiconductor fins 112, 114 and 116. In some embodiments, the gate dielectrics 122, 124 and 126 and the dummy gate structures 132, 134 and 136 may be patterned by the same process. At least one of the dummy gate structures 132, 134 and 136 may include polycrystalline-silicon (poly-Si) or poly-crystalline silicon-germanium (poly-SiGe).

Figure 2:
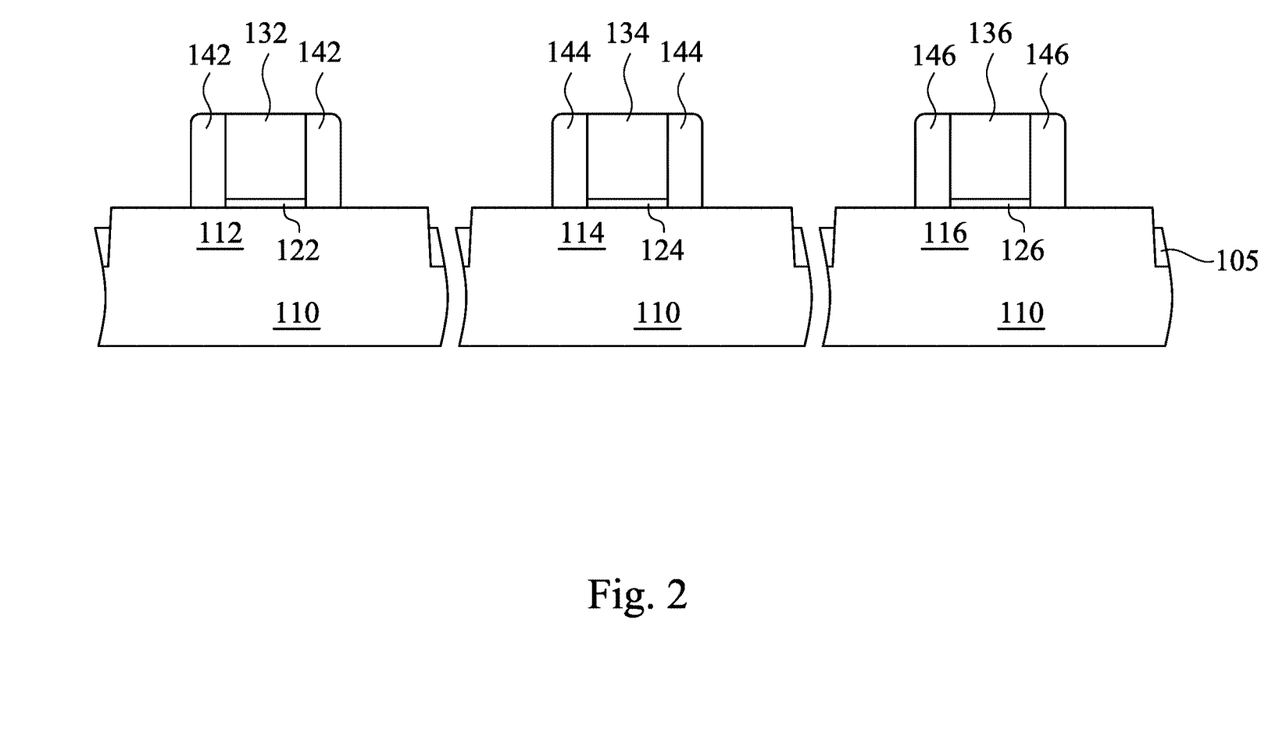

Reference is made to FIG. 2. Gate spacers 142 are formed on the substrate 110 and respectively along opposite sides of the dummy gate structure 132, gate spacers 144 are formed on the substrate 110 and respectively along opposite sides of the dummy gate structure 134, and gate spacers 146 are formed on the substrate 110 and along opposite sides of the dummy gate structure 136. In some embodiments, the gate spacers 142, 144 and 146 may include silicon oxide, silicon nitride, silicon oxy-nitride, or other suitable material. The gate spacers 142, 144 and 146 may include a single layer or multilayer structure. To form the gate spacers 142, 144 and 146, a blanket layer may be formed on the substrate 110 by CVD, PVD, ALD, or other suitable technique. Then, an anisotropic etching is performed on the blanket layer to form the gate spacers 142, 144 and 146 respectively on opposite sides of the dummy gate structures 132, 134 and 136. In some embodiments, the gate spacers 142, 144 and 146 can be used to offset subsequently formed doped regions, such as source/drain regions. The gate spacers 142, 144 and 146 can further be used for designing or modifying the source/drain region (junction) profile.

Figure 3:
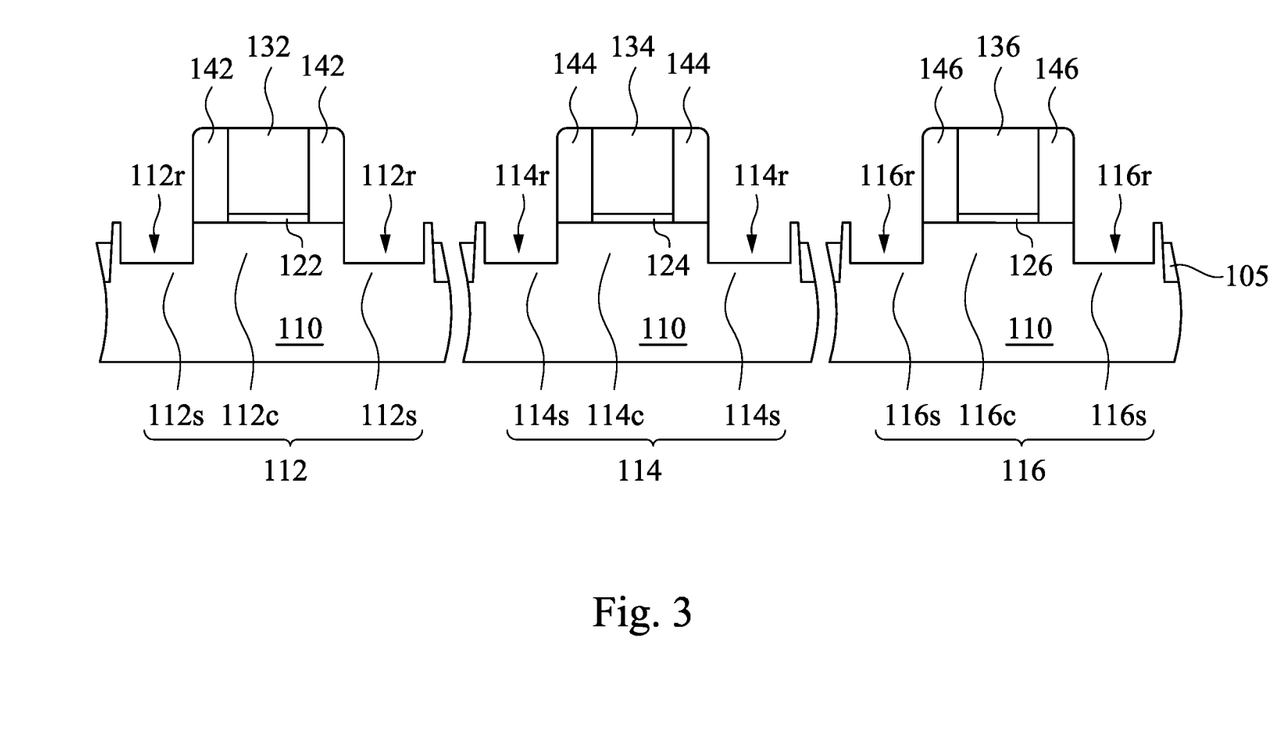

Reference is made to FIG. 3. Portions of the semiconductor fins 112, 114 and 116 exposed by the dummy gate structures 132, 134 and 136 and the gate spacers 142, 144 and 146 are removed (or recessed) to form recesses 112r, 114r and 116r in the substrate 110. Any suitable amount of material may be removed. The remaining semiconductor fin 112 has a plurality of source/drain portions 112s, and a portion of the semiconductor fin 112 between the source/drain portions 112s can serve as a semiconductor channel 112c. Similarly, there are a plurality of source/drain portions 114s and a semiconductor channel 114c present in the remaining semiconductor fin 114, and there are a plurality of source/drain portions 116s and a semiconductor channel 116c present in the remaining semiconductor fin 116. The source/drain portions 112s, 114s and 116s are embedded in the substrate 110 and portions thereof are exposed by the recesses 112r, 114r and 116r, respectively. The semiconductor channels 112c, 114c and 116c respectively underlie the dummy gate structures 132, 134 and 136.

Removing portions of the semiconductor fins 112, 114 and 116 may include forming a photoresist layer or a capping layer (such as an oxide capping layer) over the structure of FIG. 2, patterning the photoresist or capping layer to have openings that expose portions of the semiconductor fins 112, 114 and 116, and etching the exposed portions of the semiconductor fins 112, 114 and 116. In some embodiments, the semiconductor fins 112, 114 and 116 can be etched using a dry etching process. Alternatively, the etching process is a wet etching process, or combination of dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r, 114r and 116r with HF or other suitable solution.

Figure 4:
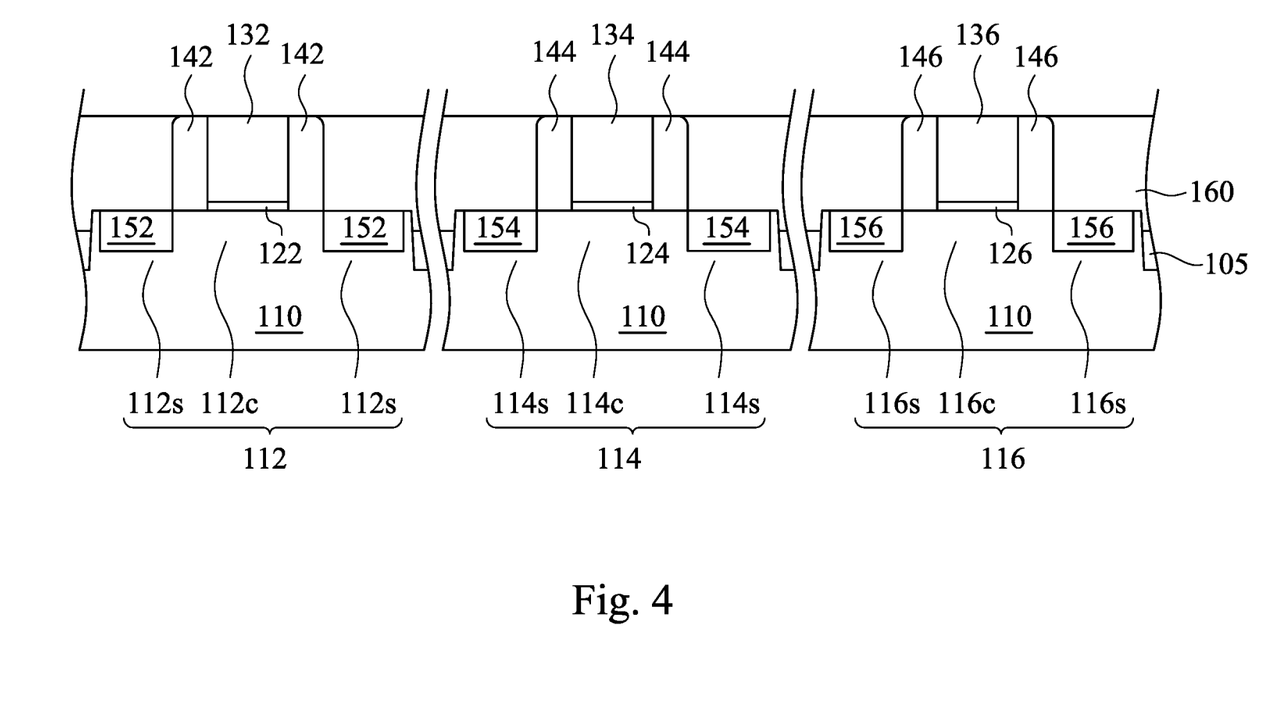

Reference is made to FIG. 4. A plurality of epitaxy structures 152, 154 and 156 are respectively formed in the recesses 112r, 114r and 116r (see FIG. 3) and on the source/drain portions 112s, 114s and 116s. The epitaxy structures 152, 154 and 156 may be formed using one or more epitaxy or epitaxial (epi) processes, such that Si features, SiGe features, and/or other suitable features can be formed in a crystalline state on the source/drain portions 112s, 114s and 116s of the semiconductor fins 112, 114 and 116. In some embodiments, the lattice constant of the epitaxy structures 152, 154 and 156 are different from the lattice constant of the semiconductor fins 112, 114 and 116, so that semiconductor channels 112c, 114c and 116c can be strained or stressed by the epitaxy structures 152, 154 and 156 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s, 114s and 116s of the semiconductor fins 112, 114 and 116 (e.g., silicon). Thus, strained or stressed semiconductor channels 112c, 114c and 116c can be achieved to increase carrier mobility and enhance device performance. The epitaxy structures 152, 154 and 156 may be in-situ doped. The doping species include P-type dopants, such as boron or $BF_2$; N-type dopants, such as phosphorus or arsenic; and/or other suitable dopants including combinations thereof. If the epitaxy structures 152, 154 and 156 are not in-situ doped, a second implantation process (i.e., a junction implant process) is performed to dope the epitaxy structures 152, 154 and 156. One or more annealing processes may be performed to activate the epitaxy structures 152, 154 and 156. The annealing processes include rapid thermal annealing (RTA) and/or laser annealing processes.

Thereafter, an interlayer dielectric (ILD) layer 160 is formed at outer sides of the gate spacers 142, 144 and 146 and on the substrate 110. The ILD layer 160 includes silicon oxide, silicon nitride, silicon oxynitride, silicon carbide, low-dielectric constant dielectric material or a combination thereof. The ILD layer 160 includes a single layer or multiple layers. The ILD layer 160 is formed by a suitable technique, such as CVD. A chemical mechanical planarization (CMP) process may be applied to remove excessive ILD layer 160 and expose top surfaces of the dummy gate structures 132, 134 and 136 to a subsequent dummy gate removal process.

Figure 5:
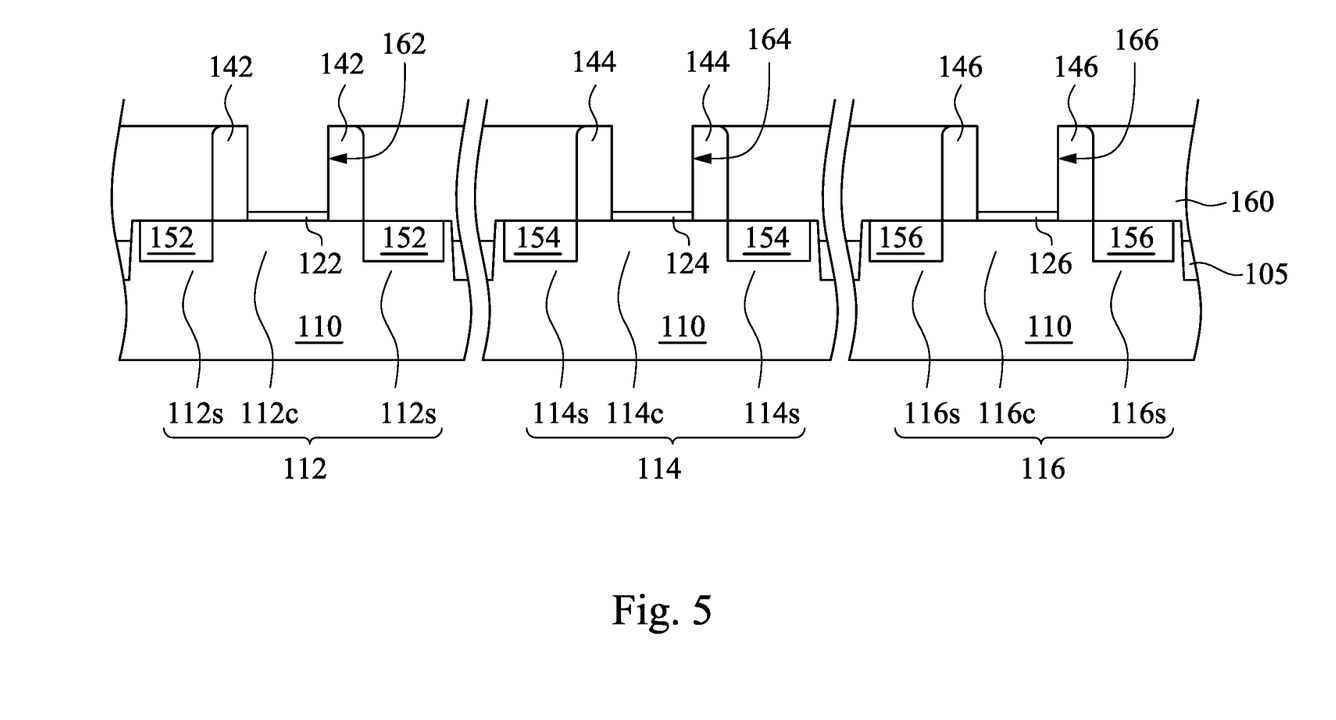

Reference is made to FIG. 5. The dummy gate structures 132, 134 and 136 (see FIG. 4) are removed to form an opening 162 with the gate spacers 142 as its sidewall, an opening 164 with the gate spacers 144 as its sidewall, and an opening 166 with the gate spacers 146 as its sidewall. In some embodiments, the gate dielectrics 122, 124 and 126 are removed as well. Alternatively, in some embodiments, the dummy gate structures 132, 134 and 136 are removed while the gate dielectrics 122, 124 and 126 retain as shown in FIG. 5. The dummy gate structures 132, 134 and 136 (and the gate dielectrics 122, 124 and 126) may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 6:
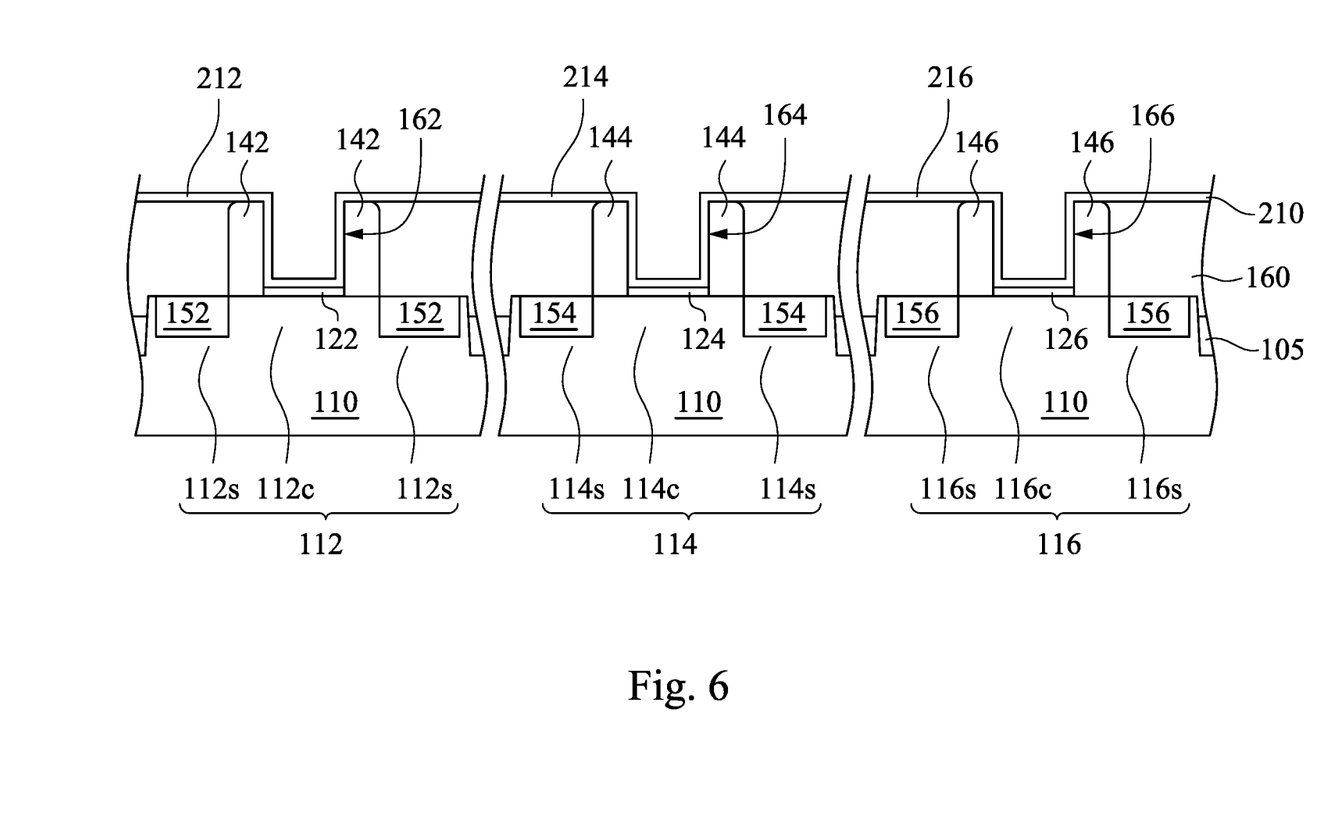

Reference is made to FIG. 6. A tantalum nitride (TaN) structure 210 can be formed on the structure shown in FIG. 5. In other words, the tantalum nitride structure 210 is formed on the semiconductor channels 112c, 114c and 116c. The tantalum nitride structure 210 can provide a suitable work function value for a gate stack of a semiconductor device, so as to benefit tuning the threshold voltage of the semiconductor device. The tantalum nitride structure 210 can be formed by suitable process, such as ALD, CVD, PVD, remote plasma CVD (RPCVD), plasma enhanced CVD (PECVD), metal organic CVD (MOCVD), sputtering, plating, other suitable processes, and/or combinations thereof. Portions of the tantalum nitride structure 210 respectively present on the semiconductor fins 112, 114 and 116 can be referred to as tantalum nitride layers 212, 214 and 216. In some embodiments, the tantalum nitride layers 212, 214 and 216 are respectively in contact with the gate dielectrics 122, 124 and 126. In some other embodiments, an additional structure, such as a titanium nitride layer, may be formed on the gate dielectrics 122, 124 and 126, and the tantalum nitride structure 210 is formed on the additional layer.

Figure 7:
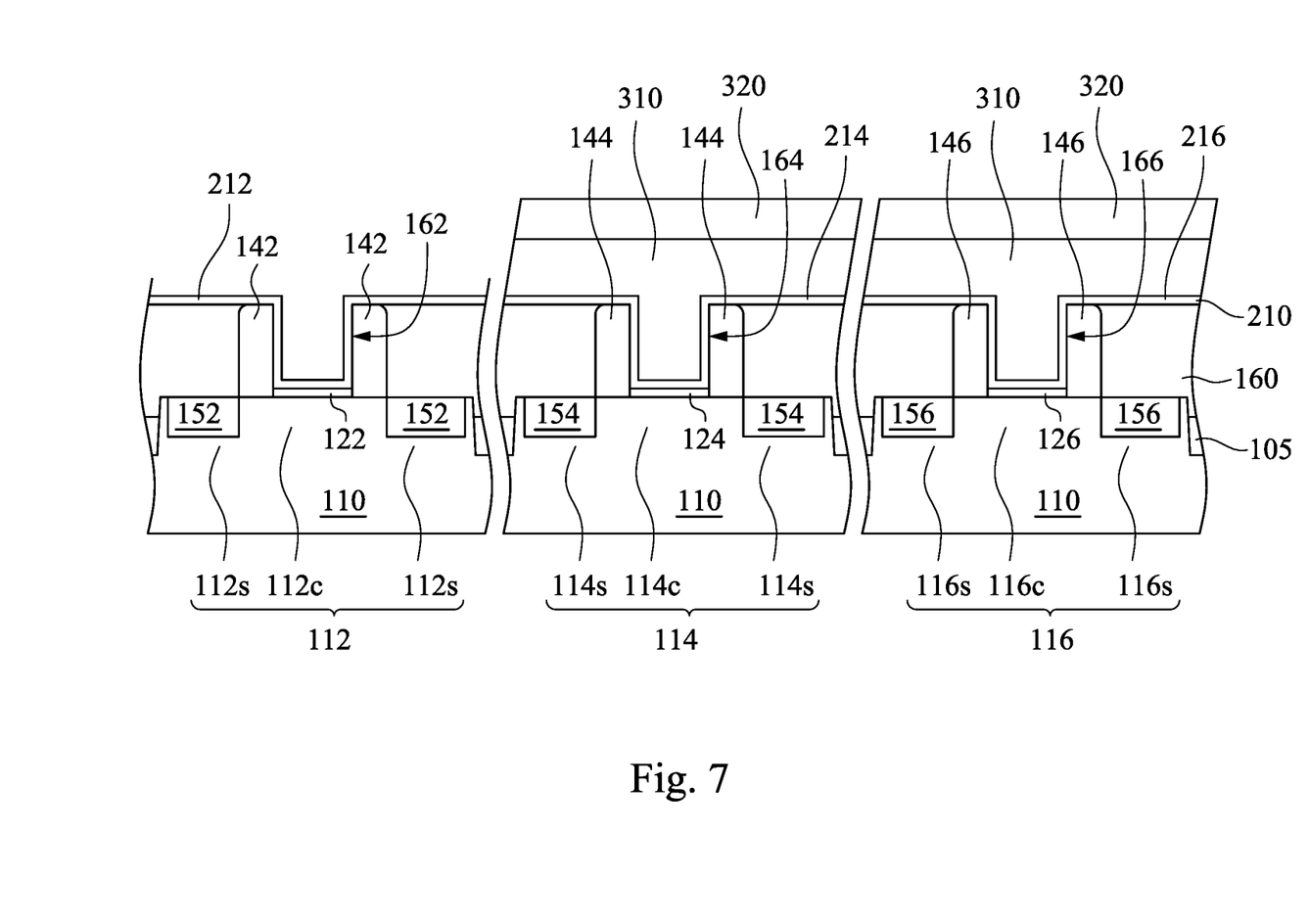

Reference is made to FIG. 7. A dielectric material 310, e.g. spin-on-glass (SOG), can be formed, covering the tantalum nitride layers 214 and 216 on the semiconductor fins 114 and 116 and filling the openings 164 and 166. A photoresist 320 can be defined over the dielectric material 310. The dielectric material 310 and the photoresist 320 can be provided for protecting the tantalum nitride layers 214 and 216 during a subsequent etching process performed to the tantalum nitride layer 212. The dielectric material 310 and the photoresist 320 can be defined by, for example, a spin-on process, a photolithographic process, and an etching process.

Figure 8:
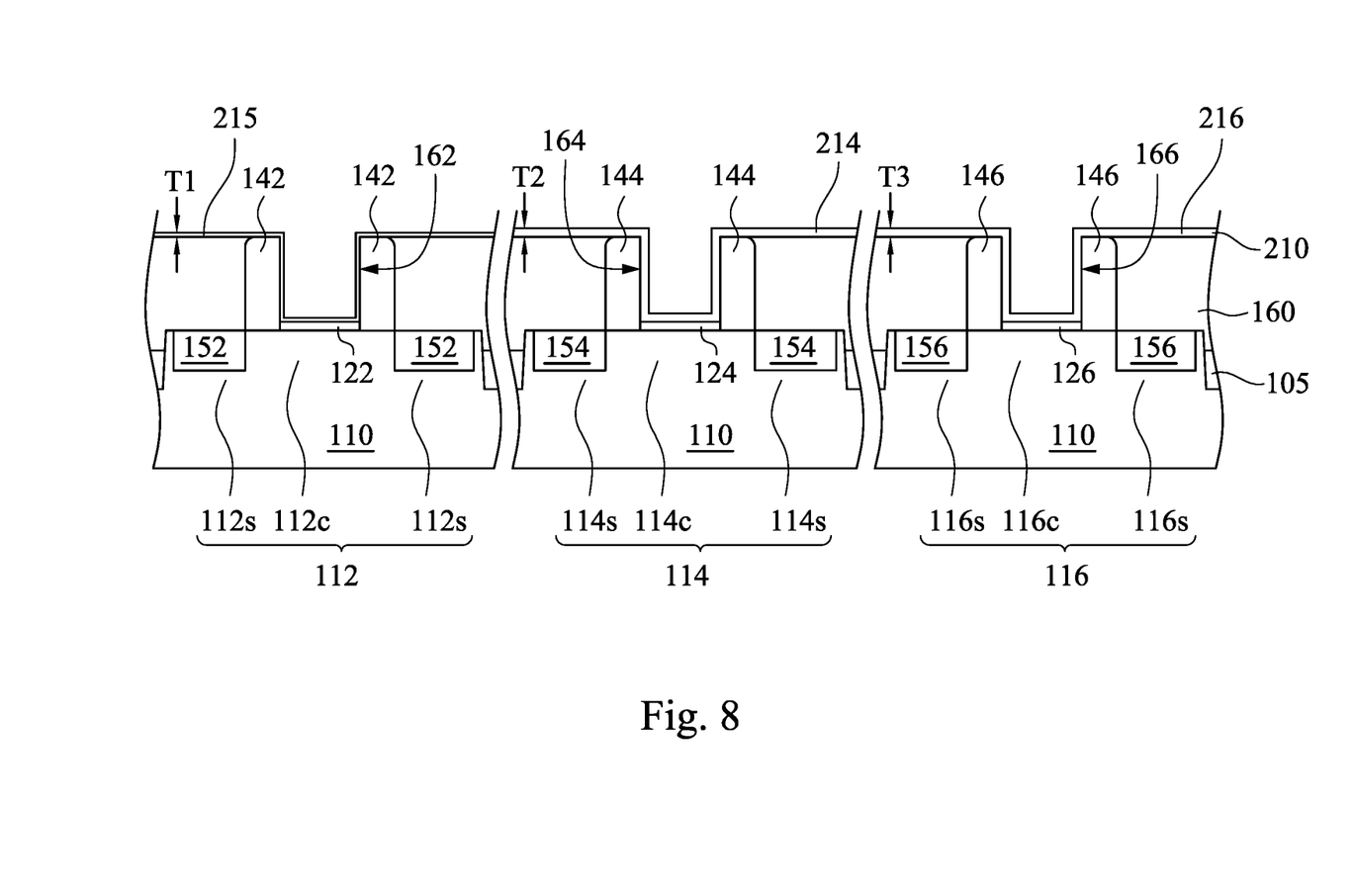

Reference is made to FIG. 8. At least a portion of the tantalum nitride layer 212 on the semiconductor fin 112 that is not covered by the dielectric material 310 and the photoresist 320 shown in FIG. 7 can be removed. Therefore, in some embodiments, the tantalum nitride layer 212 on the semiconductor fin 112 can be thinned as a thinner tantalum nitride layer 215, and the tantalum nitride layers 214 and 216 on the semiconductor fins 114 and 116 covered by the dielectric material 310 and the photoresist 320 are not thinned, so they may be referred to as thicker tantalum nitride layers 214 and 216 that are thicker than the thinner tantalum nitride layer 215. In other words, the thinner tantalum nitride layer 215 on the semiconductor channel 112c has a thickness T1, the thicker tantalum nitride layers 214 and 216 on the semiconductor channels 114c and 116c have thicknesses T2 and T3, and the thickness T1 is different from the thicknesses T2 and T3. More particularly, the thickness T1 is less than the thicknesses T2 and T3. In some embodiments, the thicknesses T2 and T3 may be substantially the same because the tantalum nitride layers 214 and 216 on the semiconductor channels 114c and 116c are not thinned, trimmed or removed. In some embodiments, the difference between the thickness T1 and the thickness T2 or T3 may range from about 5 Å to about 20 Å, so as to benefit to generate predetermined threshold voltage difference between different FinFETs. In some embodiments, the thickness T1 ranges from about 1 Å to about 5 Å, so as to benefit to generate predetermined threshold voltage for the FinFET formed by the semiconductor fin 112. In some embodiments, the thickness T2, T3 or combinations thereof may range from about 5 Å to about 25 Å. After removing at least a portion of the tantalum nitride layer 212 on the semiconductor fin 112, the dielectric material 310 and the photoresist 320 shown in FIG. 7 can be removed by a wet etching process, a dry etching process, or combinations thereof.

As the thickness of the tantalum nitride layer decreases, the threshold voltage of the semiconductor device shifts, and therefore, a semiconductor device, such as a FinFET, including the thinner tantalum nitride layer 215 can have a threshold voltage different from that includes the thicker tantalum nitride layer 214. In other words, the FinFETs formed by the first and the second semiconductor fins 112 and 114 can have different threshold voltages due to a thickness difference between the thinner tantalum nitride layer 215 and the thicker tantalum nitride layer 214. In some other embodiments, the tantalum nitride layer 212 on the semiconductor fin 112 can be removed without leaving the thinner tantalum nitride layer 215 on the semiconductor fin 112. In other words, tantalum nitride can be absent on the semiconductor channel 112c. Since tantalum nitride is still present on the semiconductor channel 114c, the tantalum nitride amount difference can enable the FinFETs formed by the first and the second semiconductor fins 112 and 114 to have different threshold voltages as well.

Figure 9:
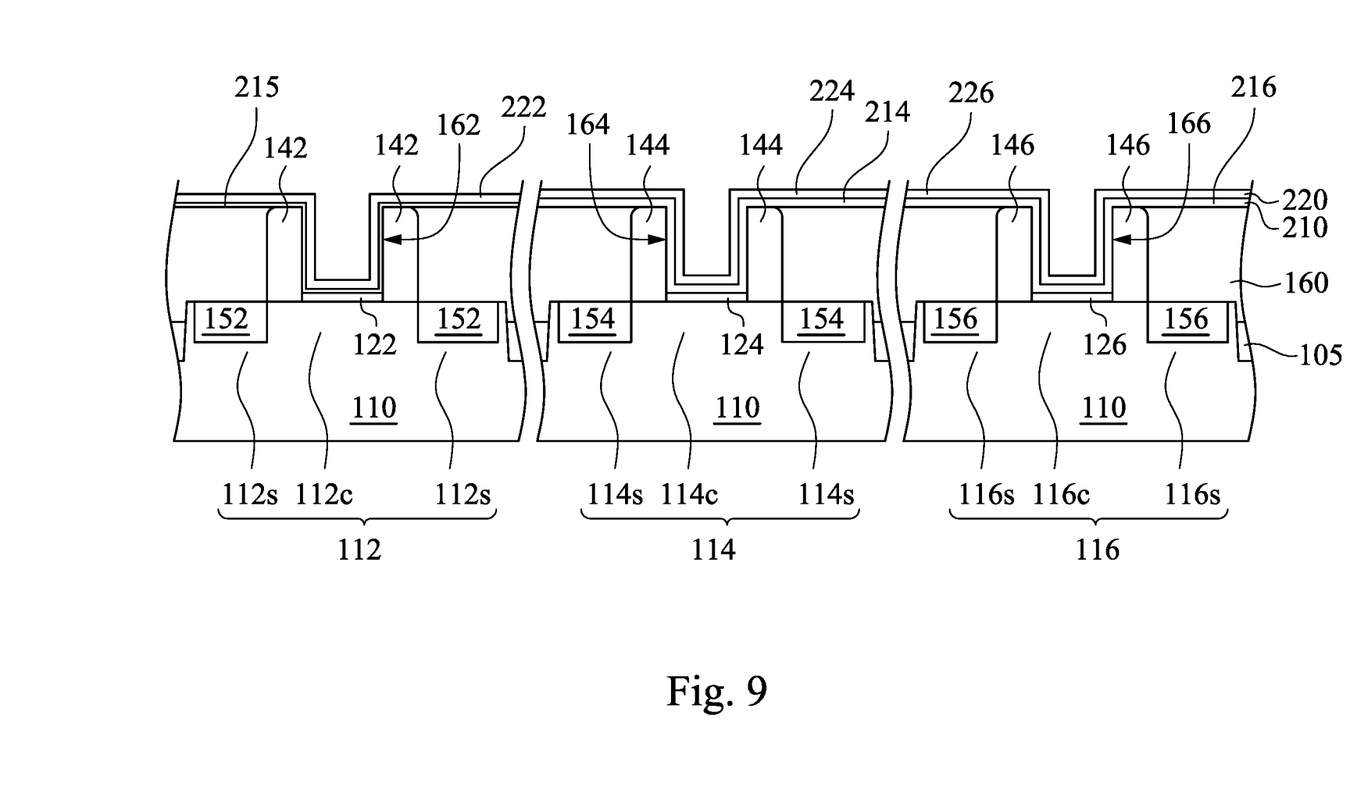

Reference is made to FIG. 9. A work function material 220 can be formed on the structure shown in FIG. 8. The work function material 220 can provide another suitable work function value for the gate stack of the semiconductor device. In some embodiments, the work function material 220 may include a titanium-containing material, such as, for example, titanium nitride (TiN), titanium aluminum carbide (TiAlC) or other suitable material. In some embodiments, tantalum is absent in the work function material 220. In other words, the work function material 220 is made of a material other than tantalum nitride. The work function material 220 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the work function material 220 respectively present on the semiconductor fins 112, 114 and 116 can be referred to as work function layers 222, 224 and 226. When the work function material 220 includes the titanium-containing material, the work function layers 222, 224 and 226 can be referred to as titanium-containing layers.

Figure 10:
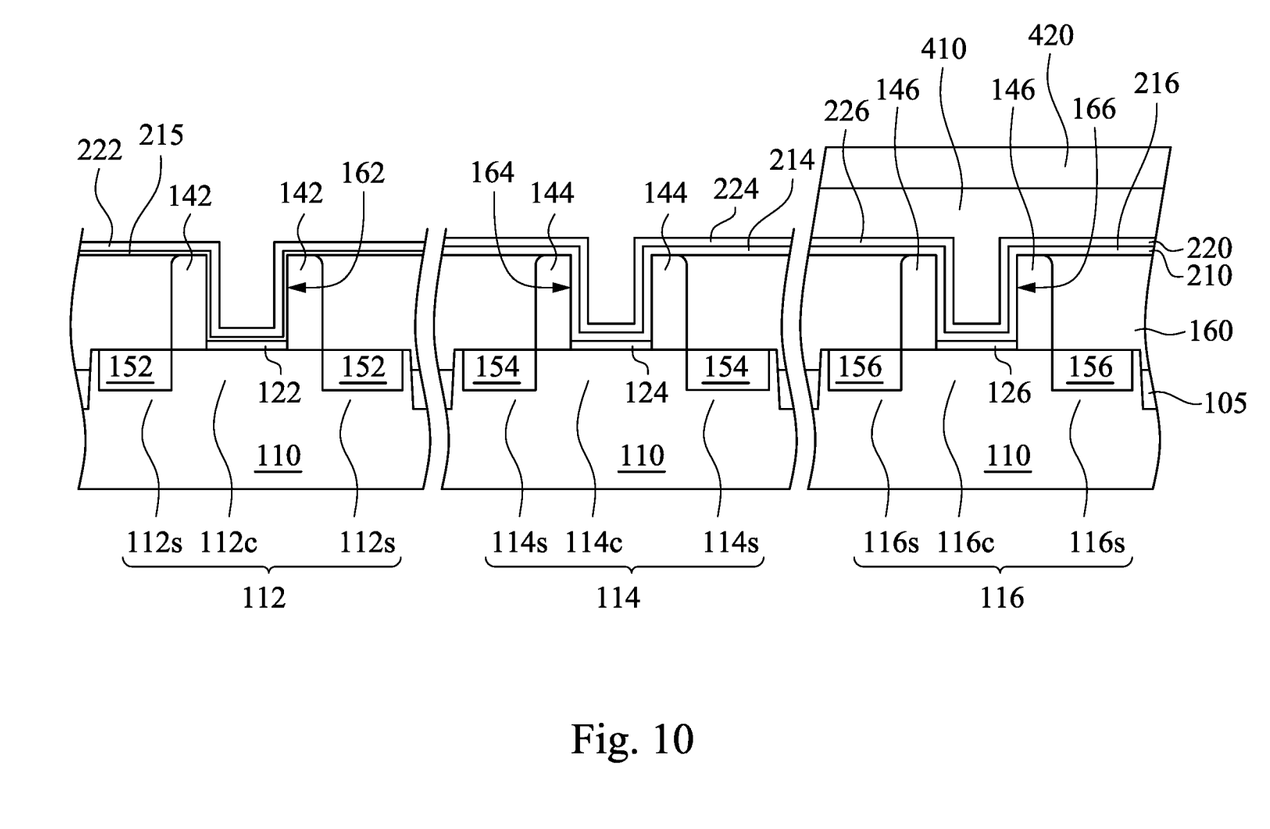

Reference is made to FIG. 10. A dielectric material 410, e.g. spin-on-glass (SOG), can be formed, covering the work function layer 226 on the semiconductor fin 116 and filling the opening 166. A photoresist 420 can be defined over the dielectric material 410. The dielectric material 410 and/or the photoresist 420 can be provided for patterning the work function material 220. The dielectric material 410 and the photoresist 420 can be defined by, for example, a spin-on process, a photolithographic process, and an etching process.

Figure 11:
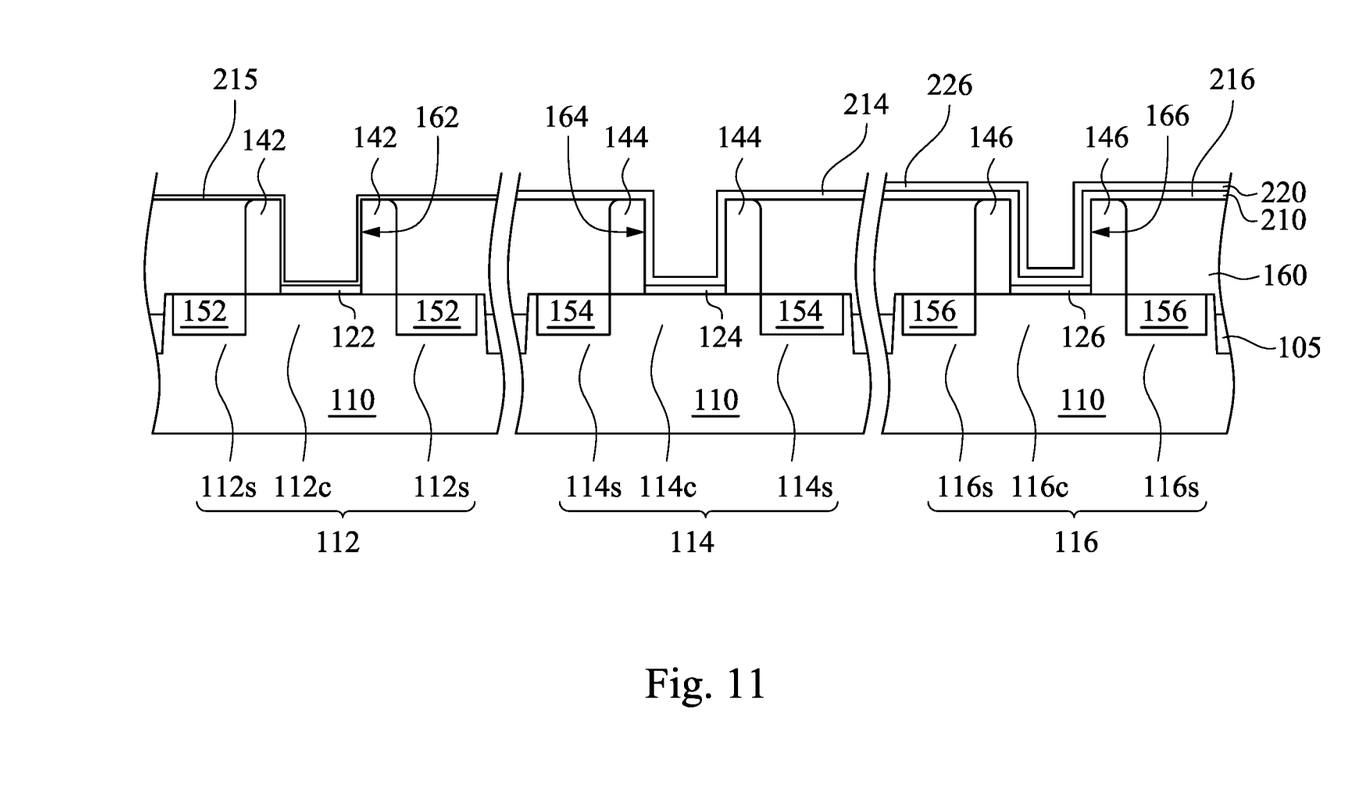

Reference is made to FIG. 11. The work function layers 222 and 224 on the semiconductor fins 112 and 114 that are not covered by the dielectric material 410 and the photoresist 420 shown in FIG. 10 can be removed, so that the work function material 220 can be patterned to remain on the semiconductor fin 116, and not on the semiconductor fins 112 and 114. After patterning the work function material 220, the dielectric material 410 and the photoresist 420 shown in FIG. 10 can be removed by a wet etching process, a dry etching process, or combinations thereof, thereby exposing the remained work function material 220. After the patterning, the thinner tantalum nitride layer 215 is present on the semiconductor channel 112c, the thicker tantalum nitride layer 214 is present on the semiconductor channel 114c, and the thicker tantalum nitride layer 216 and the work function layer 226 is present on the semiconductor channel 116c.

Figure 12:
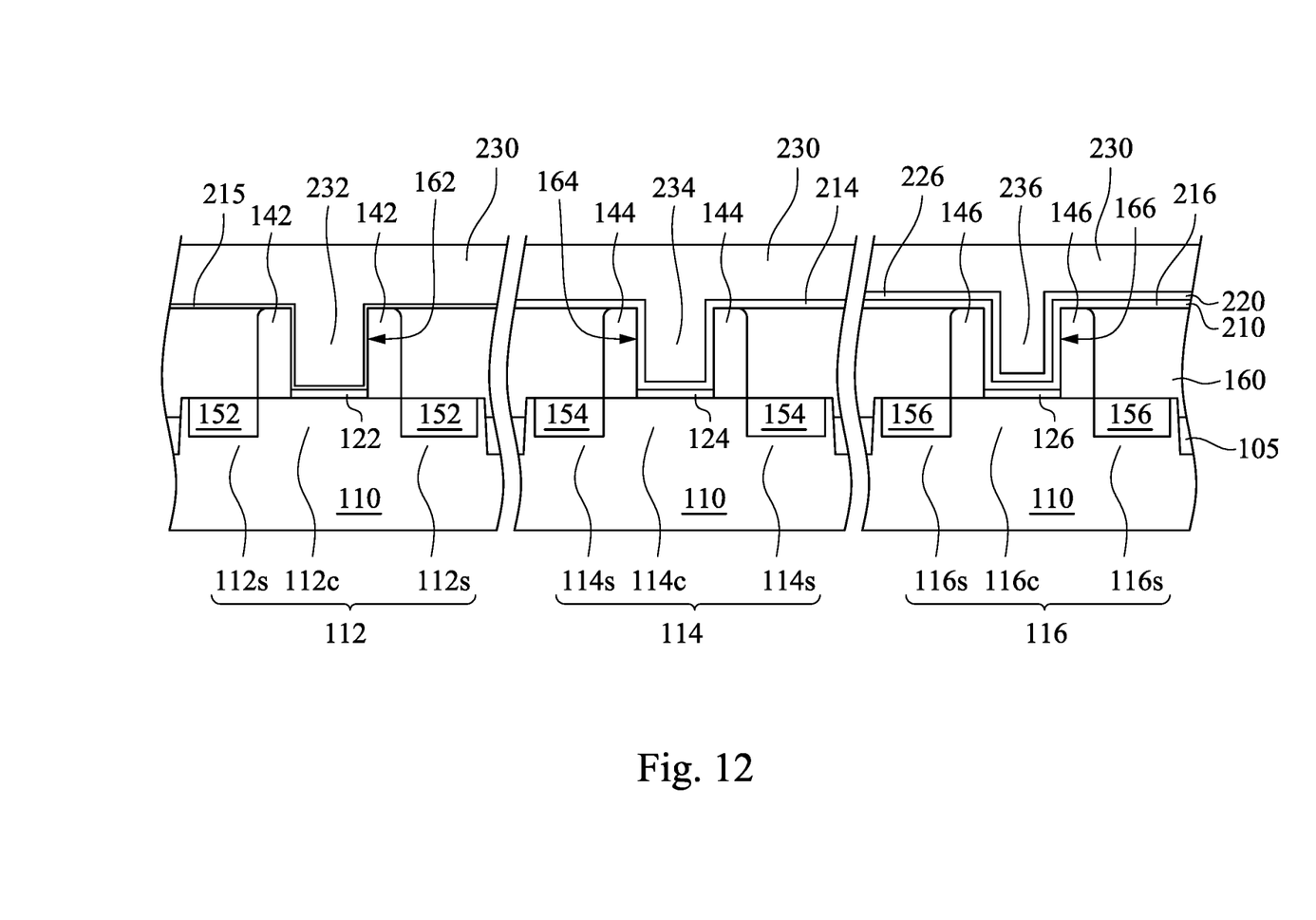

Reference is made to FIG. 12. Remaining openings 162, 164 and 166 are then filled or overfilled with a filling conductor 230. In some embodiments, the filling conductor 230 includes tungsten (W). The filling conductor 230 can be formed using ALD, PVD, CVD, or other suitable process. In some other embodiments, the filling conductor 230 includes aluminum (Al), copper (Cu), nickel (Ni), cobalt (Co) or other suitable conductive material. Portions of the filling conductor 230 respectively present in the openings 162, 164 and 166 can be referred to as filling conductor layers 232, 234 and 236.

Figure 13:
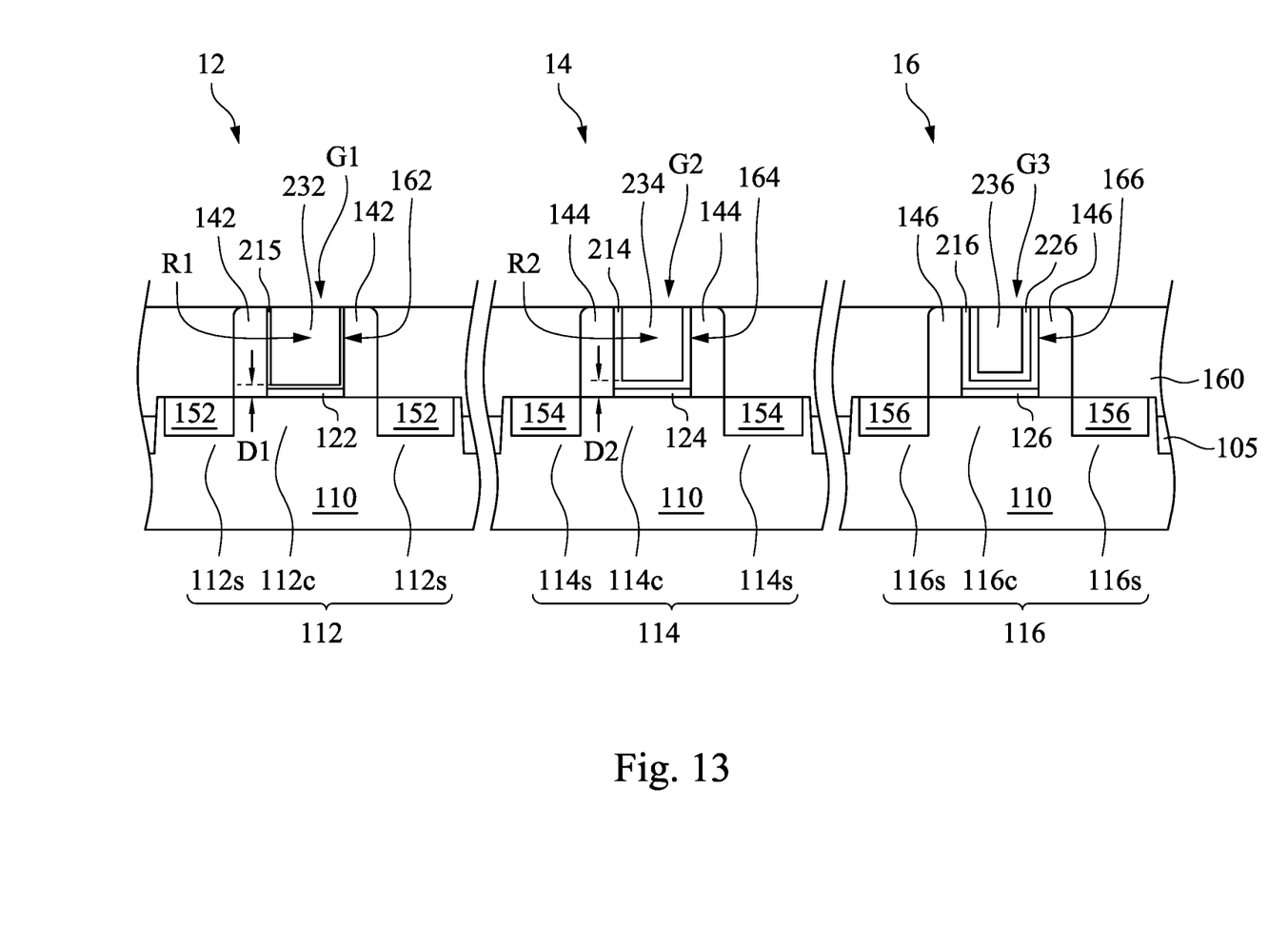

Reference is made to FIG. 13. A chemical mechanical planarization (CMP) process is applied to remove excessive the tantalum nitride structure 210, the work function material 220 and the filling conductor 230 outside the openings 162, 164 and 166 to provide a substantially planar top surface. The remaining thinner tantalum nitride layer 215 and the remaining filling conductor layer 232 form a gate stack G1 in the opening 162. The remaining thicker tantalum nitride layer 214 and the remaining filling conductor layer 234 form a gate stack G2 in the opening 164. The remaining thicker tantalum nitride layer 216, the remaining work function layer 226, and the remaining filling conductor layer 236 together form a gate stack G3 in the opening 166. The gate stacks G1, G2 and G3 may be referred to as metal gate electrodes in some cases. It is understood that the formation of the gate stacks G1, G2 and G3 mentioned above is illustrative, and is not limiting the present disclosure.

In FIG. 13, the semiconductor fin 112, the epitaxy structures 152 and the gate stack G1 form a FinFET 12, the semiconductor fin 114, the epitaxy structures 154 and the gate stack G2 form a FinFET 14, and the semiconductor fin 116, the epitaxy structures 156 and the gate stack G3 form a FinFET 16. In some embodiments, at least one of the FinFETs 12, 14 and 16 may be an N-type FinFET when the at least one of the FinFETs 12, 14 and 16 includes N-type doped source/drain epitaxy structures. In some embodiments, at least one of the FinFETs 12, 14 and 16 may be a P-type FinFET when the at least one of the FinFETs 12, 14 and 16 includes P-type doped source/drain epitaxy structures.

Since the thinner tantalum nitride layer 215 and the thicker tantalum nitride layer 214 have different thicknesses T1 and T2, the gate stack G1 and the gate stack G2 are different at least in tantalum nitride amount. In other words, the gate stacks G1 and G2 have different tantalum nitride amount per unit area. Such a thickness difference between the tantalum nitride layers 215 and 214 or such a tantalum nitride amount difference between the gate stacks G1 and G2 can make the effective work function of the gate stack G1 different from that of the gate stack G2. Therefore, the FinFET 12 can have a threshold voltage different from that of the FinFET 14. In other words, thicknesses of the tantalum nitride layers in different gate stacks of FinFETs can be adjusted to make threshold voltages of the FinFETs different. Stated differently, the gate stacks may be formed to be different at least in tantalum nitride amount, so as to generate different threshold voltages for the FinFETs. In some other embodiments, tantalum nitride is absent in the gate stack G1 and is present in gate stack G2, and such a tantalum nitride amount difference between the gate stacks G1 and G2 can generate different threshold voltages for the FinFETs 12 and 14 as well. In some embodiments, since the tantalum nitride amount difference between the gate stacks G1 and G2 enables the FinFETs 12 and 14 to have predetermined different threshold voltages, work function metal other than tantalum nitride may be absent in the gate stacks G1 and G2. In other words, the gate stacks G1 and G2 may not include work function metal other than tantalum nitride in some embodiments.

In the gate stack G3, an additional work function layer 226 is included, and the thicker tantalum nitride layer 216 is present between the work function layer 226 and the semiconductor channel 116c. Therefore, the FinFETs 14 and 16 have different threshold voltages, and moreover, the difference between the threshold voltages of the FinFETs 12 and 16 can be increased.

In some embodiments, the filling conductor layer 232 and the semiconductor channel 112c define a first distance D1, and the filling conductor layer 234 and the semiconductor channel 114c define a second distance D2. The first distance D1 correlates with the thickness T1 of the thinner tantalum nitride layer 215 because the thinner tantalum nitride layer 215 is present between the filling conductor layer 232 and the semiconductor channel 112c. Similarly, the second distance D2 correlates with the thickness T2 of the thicker tantalum nitride layer 214 because the thicker tantalum nitride layer 214 is present between the filling conductor layer 234 and the semiconductor channel 114c. As such, the first distance D1 is different from the second distance D2 because the thinner tantalum nitride layer 215 and the thicker tantalum nitride layer 214 have different thicknesses T1 and T2. More particularly, the first distance D1 is shorter than the second distance D2 because the thickness T1 of the thinner tantalum nitride layer 215 is less than the thickness T2 of the thicker tantalum nitride layer 214. In some embodiments, when the gate dielectrics 122 and 124 have substantially the same thickness, a difference between the first and second distances D1 and D2 is substantially the same as a difference between the thicknesses T1 and T2 of the thinner tantalum nitride layer 215 and the thicker tantalum nitride layer 214.

In some embodiments, the filling conductor layer 232 is present in a recess R1 of the thinner tantalum nitride layer 215, and the filling conductor layer 234 is present in a recess R2 of the thicker tantalum nitride layer 214. Since the thinner tantalum nitride layer 215 is present among the filling conductor layer 232 and the gate spacers 142, and the thicker tantalum nitride layer 214 is present among the filling conductor layer 234 and the gate spacers 144, widths of the filling conductor layers 232 and 234 correlates with the thicknesses T1 and T2 of the tantalum nitride layers 214 and 215. Since the thicknesses T1 and T2 of the tantalum nitride layers 214 and 215 are different, the filling conductor layers 232 and 234 can have different widths. More particularly, since the thinner tantalum nitride layer 215 is thinner than the thicker tantalum nitride layer 214, the filling conductor layer 232 may be wider than the filling conductor layer 234.

In some embodiments, gate stacks are different at least in tantalum nitride amount, and therefore, the gate stacks can have different effective work functions, so that different threshold voltages can be achieved. In some embodiments, the difference in tantalum nitride content/amount is implemented through the use of tantalum nitride layers with different thicknesses in the metal gate structures. The tantalum nitride layers with different thicknesses can tune the metal gate electrodes to have different effective work functions, so that different threshold voltages can be achieved.

According to some embodiments, a semiconductor device includes a first semiconductor channel, a second semiconductor channel, a first gate stack and a second gate stack. The first gate stack is present on the first semiconductor channel. The second gate stack is present on the second semiconductor channel. The first gate stack and the second gate stack are different at least in tantalum nitride amount.

According to some embodiments, a semiconductor device includes a first semiconductor channel, a second semiconductor channel, a first metal gate electrode and a second metal gate electrode. The first metal gate electrode is present on the first semiconductor channel and includes a thinner tantalum nitride layer. The second metal gate electrode is present on the second semiconductor channel and includes a thicker tantalum nitride layer that is thicker than the thinner tantalum nitride layer.

According to some embodiments, a method of manufacturing a semiconductor device includes forming a tantalum nitride structure on a first semiconductor channel and a second semiconductor channel, removing at least a portion of the tantalum nitride structure on the first semiconductor channel, and forming a filling conductor on the first semiconductor channel and the second semiconductor channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor channel;
   a second semiconductor channel;
   a first gate stack present on the first semiconductor channel; and
   a second gate stack present on the second semiconductor channel, wherein the first gate stack and the second gate stack are different at least in tantalum nitride amount, wherein the first gate stack comprises a first tantalum nitride layer and a first filling conductor layer embedded in the first tantalum nitride layer, the second gate stack comprises a second tantalum nitride layer and a second filling conductor layer embedded in the second tantalum nitride layer, the first filling conductor layer and the first semiconductor channel define a first distance, the second filling conductor layer and the second semiconductor channel define a second distance, and the first distance is different from the second distance.

2. The semiconductor device of claim 1, wherein the first tantalum nitride layer and the second tantalum nitride layer have different thicknesses.

3. The semiconductor device of claim 2, wherein the first tantalum nitride layer is thinner than the second tantalum nitride layer, and the second gate stack further comprises a work function layer made of a material other than tantalum nitride.

4. The semiconductor device of claim 3, wherein the second tantalum nitride layer is present between the work function layer and the second semiconductor channel.

5. The semiconductor device of claim 1, wherein the first tantalum nitride layer is thinner than the second tantalum nitride layer, and the first distance is shorter than the second distance.

6. The semiconductor device of claim 1, wherein a difference between the first and second distances is substantially the same as a difference between thicknesses of the first and second tantalum nitride layers.

7. The semiconductor device of claim 1, wherein the first filling conductor layer and the second filling conductor layer have different widths.

8. The semiconductor device of claim 7, wherein the first tantalum nitride layer is thinner than the second tantalum nitride layer.

9. The semiconductor device of claim 8, wherein the first filling conductor layer is wider than the second filling conductor layer.

10. The semiconductor device of claim 1, wherein tantalum nitride is absent in the first gate stack.

11. A semiconductor device, comprising:
    a first semiconductor channel;
    a second semiconductor channel;
    a first metal gate electrode present on the first semiconductor channel and comprising a thinner tantalum nitride layer; and
    a second metal gate electrode present on the second semiconductor channel and comprising a thicker tantalum nitride layer that is thicker than the thinner tantalum nitride layer, wherein the first metal gate electrode further comprises a first filling conductor layer embedded in the thinner tantalum nitride layer, the second metal gate electrode further comprises a second filling conductor layer embedded in the thicker tantalum nitride layer, and the first filling conductor layer is wider than the second filling conductor layer.

12. The semiconductor device of claim 11, wherein a distance from the first filling conductor layer to the first semiconductor channel is shorter than that from the second filling conductor layer to the second semiconductor channel.

13. The semiconductor device of claim 11, wherein the first metal gate electrode and the second metal gate electrode do not comprise work function metal other than tantalum nitride.

14. The semiconductor device of claim 11, wherein the second metal gate electrode further comprises a titanium-containing layer present between the thicker tantalum nitride layer and the second semiconductor channel.

15. A semiconductor device, comprising:
- a first semiconductor fin protruding from a substrate;
- a second semiconductor fin protruding from the substrate;
- a first gate stack over the first semiconductor fin, the first gate stack comprising a first conductor and a first tantalum nitride layer wrapping the first conductor, wherein the first conductor is between portions of the first tantalum nitride layer; and
- a second gate stack over the second semiconductor fin, the second gate stack comprising a second conductor and a second tantalum nitride layer wrapping the second conductor, wherein the first tantalum nitride layer has a thickness less than a thickness of the second tantalum nitride layer.

16. The semiconductor device of claim 15, further comprising:
- a first high-k dielectric layer, wherein the first tantalum nitride layer is between the first high-k dielectric layer and the first conductor.

17. The semiconductor device of claim 16, further comprising:
- a second high-k dielectric layer, wherein the second tantalum nitride layer is between the second high-k dielectric layer and the second conductor.

18. The semiconductor device of claim 15, further comprising:
- a work function layer wrapped by the second tantalum nitride layer, the work function layer wrapping the second conductor.

19. The semiconductor device of claim 15, wherein opposite sidewalls and a bottom surface of the first conductor are in contact with the first tantalum nitride layer.

20. The semiconductor device of claim 15, wherein opposite sidewalls and a bottom surface of the second conductor are in contact with the second tantalum nitride layer.

* * * * *